US012607925B2

(12) United States Patent (10) Patent No.: US 12,607,925 B2
Ono et al. (45) Date of Patent: Apr. 21, 2026

(54) PELLICLE, EXPOSURE ORIGINAL PLATE, EXPOSURE DEVICE, METHOD OF MANUFACTURING PELLICLE, AND METHOD OF MANUFACTURING SEMICONDUCTOR DEVICE

(71) Applicant: MITSUI CHEMICALS, INC., Tokyo (JP)

(72) Inventors: Yousuke Ono, Sodegaura (JP); Atsushi Okubo, Tokyo (JP); Kazuo Kohmura, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 667 days.

(21) Appl. No.: 18/003,560

(22) PCT Filed: Aug. 3, 2021

(86) PCT No.: PCT/JP2021/028799
§ 371 (c)(1),
(2) Date: Dec. 28, 2022

(87) PCT Pub. No.: WO2022/030499
PCT Pub. Date: Feb. 10, 2022

(65) Prior Publication Data
US 2023/0244138 A1 Aug. 3, 2023

(30) Foreign Application Priority Data

Aug. 6, 2020 (JP) ................................. 2020-134100

(51) Int. Cl.
| *G03F 1/64* | (2012.01) |
| *G03F 7/00* | (2006.01) |
| *H10P 76/20* | (2026.01) |

(52) U.S. Cl.
CPC ............ *G03F 1/64* (2013.01); *G03F 7/70033* (2013.01); *G03F 7/70166* (2013.01); *H10P 76/2041* (2026.01)

(58) Field of Classification Search
CPC ...................................... G03F 1/64; G03F 1/62
See application file for complete search history.

(56) References Cited

U.S. PATENT DOCUMENTS

| 2011/0129767 A1 | 6/2011 | Shirasaki et al. |
| 2011/0236807 A1 | 9/2011 | Shirasaki |
| 2017/0184956 A1 | 6/2017 | Kohmura et al. |
| 2017/0184957 A1 | 6/2017 | Kohmura et al. |
| 2018/0329314 A1* | 11/2018 | Kruizinga ................. G03F 1/64 |
| 2019/0129300 A1 | 5/2019 | Ono et al. |
| 2020/0064729 A1 | 2/2020 | Kohmura et al. |
| 2020/0174361 A1 | 6/2020 | Yanase |
| 2020/0401039 A1 | 12/2020 | Ono et al. |
| 2021/0286257 A1 | 9/2021 | Yanase |

FOREIGN PATENT DOCUMENTS

| JP | H11295880 A | 10/1999 |
| JP | 2001312048 A | 11/2001 |
| JP | 2006091667 A | 4/2006 |
| JP | 2011-070009 A | 4/2011 |
| JP | 2011-113033 A | 6/2011 |
| JP | 2011203568 A | 10/2011 |
| JP | 2013195950 A | 9/2013 |
| JP | 2020091310 A | 6/2020 |
| WO | 2015/182483 A1 | 12/2015 |
| WO | 2016/043292 A1 | 3/2016 |
| WO | 2016/043301 A1 | 3/2016 |
| WO | 2018/008594 A1 | 1/2018 |
| WO | 2018151056 A1 | 8/2018 |
| WO | 2019172141 A1 | 9/2019 |
| WO | 2020008977 A1 | 1/2020 |

* cited by examiner

*Primary Examiner* — Daborah Chacko-Davis
(74) *Attorney, Agent, or Firm* — BUCHANAN INGERSOLL & ROONEY PC

(57) ABSTRACT

A pellicle including: a pellicle film including a carbon-based film having a carbon content rate of 40 mass % or more; a support frame that supports the pellicle film; and an adhesive layer containing an adhesive, the pellicle having the total amount of aqueous outgas of $5.0 \times 10^{-4}$ Pa·L/sec or less in an atmosphere of 23° C. and $1 \times 10^{-3}$ Pa or less.

10 Claims, 2 Drawing Sheets

PELLICLE, EXPOSURE ORIGINAL PLATE, EXPOSURE DEVICE, METHOD OF MANUFACTURING PELLICLE, AND METHOD OF MANUFACTURING SEMICONDUCTOR DEVICE

TECHNICAL FIELD

The present disclosure relates to a pellicle, an exposure original plate, an exposure device, a method of manufacturing a pellicle, and a method of manufacturing a semiconductor device.

BACKGROUND ART

In a technique (photolithography) in which a photosensitive substance is applied to a surface of an object such as an electronic component, a printed circuit board, or a display panel and exposed in a pattern shape to form a pattern, a transparent substrate, called a photomask, in which a pattern is formed on one surface is used.

In recent years, as enhancement in definition of exposure patterns proceeds, use of extreme ultra violet (EUV) light having a shorter wavelength has been expanded as a light source for exposure instead of deep ultra violet (DUV) light. In an exposure method using EUV light, a photomask including a reflection layer that reflects exposure light may be used.

For example, Japanese Patent Application Laid-Open (JP-A) No. 2020-091310 A discloses a pellicle having the amount of released aqueous gas of $1\times10^{-3}$ Pa·L/s or less per pellicle, the amount of released hydrocarbon-based gas of $1\times10^{-5}$ Pa·L/s or less per pellicle in a range of measured mass number of 45 to 100 amu, and the amount of released hydrocarbon-based gas of $4\times10^{-7}$ Pa·L/s or less per pellicle in a range of measured mass number of 101 to 200 amu, in vacuum after the pellicle being left to stand for 10 minutes in an atmosphere of 23° C. and $1\times10^{-3}$ Pa or less.

In addition, for example, International Publication No. WO 2018/151056 A discloses a pellicle including an inorganic layer on a surface of an adhesive layer, the inorganic layer having a mass absorption coefficient ($\mu_m$) in a range of $5\times10^{3}$ cm²/g to $2\times10^{5}$ cm²/g.

SUMMARY OF INVENTION

Technical Problem

According to the study of the present inventors, it has been found that, under a conventionally used deep ultra violet (DUV) environment, photon energy of DUV is smaller than ionization energy of water, and thus that water does not generate an oxidant such as hydroxy radicals. Therefore, it is considered that deterioration of a pellicle film due to an outgas of water generated from the pellicle does not cause a major problem.

However, under an exposure environment of extreme ultra violet (EUV) light, hydrogen gas present in an exposure atmosphere absorbs EUV light to be ionized, and hydrogen radicals, hydrogen ions, hydrogen plasma, and the like are generated.

In addition, under the exposure environment of EUV light, residual moisture or the like present in the exposure atmosphere absorbs EUV light to generate hydroxy radicals, oxygen radicals, and the like.

Under the exposure environment of extreme ultra violet (EUV) light, the pellicle film may have a high temperature of approximately 500° C. to 1000° C., and heating and cooling are repeated at a cycle of about 100 msec.

In view of the above, under the exposure environment of EUV light, the deterioration of the pellicle film due to oxidation easily proceeds.

In particular, since carbon materials are easily affected by oxidation, for example, when a pellicle film containing carbon nanotubes is used, the deterioration of the pellicle film due to oxidation more easily proceeds.

A problem to be solved by an embodiment of the present disclosure is to provide a pellicle capable of suppressing the deterioration of a pellicle film, an exposure original plate, and an exposure device.

A problem to be solved by another embodiment of the present disclosure is to provide a method of manufacturing a pellicle capable of suppressing deterioration of a pellicle film, and a method of manufacturing a semiconductor device.

Solution to Problem

Specific means for solving the problems include the following aspects.

<1> A pellicle including:
- a pellicle film including a carbon-based film having a carbon content rate of 40 mass % or more;
- a support frame that supports the pellicle film; and
- an adhesive layer containing an adhesive,
- the pellicle having a total amount of aqueous outgas of $5.0\times10^{-4}$ Pa·L/sec or less in an atmosphere of 23° C. and $1\times10^{-3}$ Pa or less.

<2> The pellicle according to <1>, wherein the adhesive layer has a moisture content rate of 2.00 mass % or less.

<3> The pellicle according to <1> or <2>, wherein the adhesive layer inside the pellicle has a surface area of 0.03 cm² to 2.5 cm².

<4> The pellicle according to any one of <1> to <3>, wherein the support frame includes a first support frame that supports the pellicle film and a second support frame connected to the first support frame.

<5> The pellicle according to any one of <1> to <4>, further including a separator disposed in contact with the adhesive layer.

<6> An exposure original plate including:
- an original plate having a pattern; and
- the pellicle according to any one of <1> to <5> attached to a surface of the original plate having a pattern.

<7> An exposure device including the exposure original plate according to <6>.

<8> An exposure device including:
- a light source that emits exposure light;
- the exposure original plate according to <6>; and
- an optical system that guides the exposure light emitted from the light source to the exposure original plate,
- wherein the exposure original plate is disposed such that the exposure light emitted from the light source permeates the pellicle film and is applied to the original plate.

<9> The exposure device according to <8>, wherein the exposure light is EUV light.

<10> A method of manufacturing a pellicle, the method including:
- a step of preparing a carbon-based material having a carbon content rate of 40 mass % or more;
- a step of forming a film of the carbon-based material in a sheet shape to manufacture a pellicle film;

a step of connecting the pellicle film to a support frame so as to cover an opening of the support frame having the opening; and a step of forming an adhesive layer by applying an adhesive to a surface of the support frame in an opening on a side opposite to a side to which the pellicle film is connected.

<11> A method of manufacturing a semiconductor device, the method including:

a step of allowing exposure light emitted from a light source to permeate the pellicle film of the exposure original plate according to <6> to apply the exposure light to the original plate, and reflecting the exposure light on the original plate; and a step of allowing the exposure light reflected by the original plate to permeate the pellicle film and applying the exposure light to a sensitive substrate, thereby exposing the sensitive substrate to light in a pattern shape.

Advantageous Effects of Invention

An embodiment of the present disclosure can provide a pellicle capable of suppressing deterioration of a pellicle film, an exposure original plate, and an exposure device.

Another embodiment of the present disclosure can provide a method of manufacturing a pellicle capable of suppressing deterioration of a pellicle film, and a method of manufacturing a semiconductor device.

DESCRIPTION OF EMBODIMENTS

Figure 1:
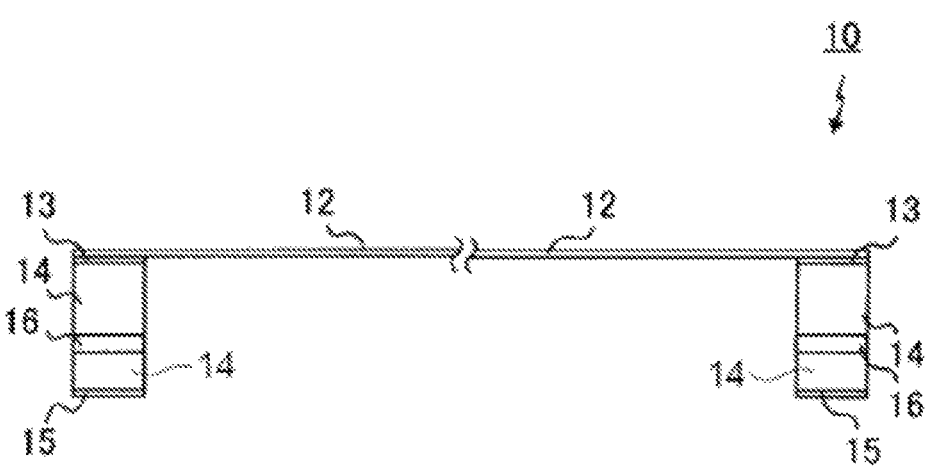
FIG. 1 is a schematic cross-sectional view showing a pellicle of the present disclosure.

In the present disclosure, a numerical range indicated using "to" means a range including numerical values described before and after "to" as a minimum value and a maximum value, respectively.

In the numerical ranges described in stages in the present disclosure, the upper limit value or the lower limit value described in a numerical range may be replaced with the upper limit value or the lower limit value of any other numerical range described in stages. In addition, in numerical ranges described in the present disclosure, the upper limit values or the lower limit values indicated as numerical ranges may be replaced with values shown in Examples.

In the present disclosure, a combination of two or more preferred aspects is a more preferred aspect.

In the present disclosure, if there are a plurality of substances corresponding to each component, the amount of each component means the total amount of the plurality of substances unless otherwise specified.

In the present disclosure, the term "step" includes not only an independent step but also a step that cannot be clearly distinguished from other steps as long as the intended purpose of step is achieved.

<<Pellicle>>

A pellicle of the present disclosure includes: a pellicle film including a carbon-based film having a carbon content rate of 40 mass % or more; a support frame that supports the pellicle film; and an adhesive layer containing an adhesive, and the pellicle has the total amount of aqueous outgas of $5.0 \times 10^{-4}$ Pa·L/sec or less in an atmosphere of 23° C. and $1 \times 10^{-3}$ Pa or less.

The pellicle of the present disclosure has the above configuration, and thus can suppress the deterioration of a pellicle film.

As described above, in an exposure environment of extreme ultra violet (EUV) light, hydrogen gas, residual moisture, or the like is exposed by EUV in an exposure atmosphere, thereby generating hydrogen radicals, hydrogen ions, hydrogen plasma, hydroxy radicals, oxygen radicals, and the like (also referred to as radicals and the like). Under the exposure environment of extreme ultra violet (EUV) light, the pellicle film has a high temperature of approximately 500° C. to 1000° C., and heating and cooling are repeated.

In view of the above, under the exposure environment of EUV light, the deterioration of the pellicle film due to oxidation easily proceeds.

The above point has not been considered as a major problem under a conventionally used DUV environment.

The pellicle of the present disclosure can suppress generation of radicals and the like by controlling the total amount of aqueous outgas generated from the pellicle in an exposure device, and thus can suppress the deterioration of a pellicle film.

The "outgas" means a gas released from each constituent member constituting the pellicle, such as an adhesive.

The "aqueous outgas" means an outgas derived from water.

The "aqueous outgas" is an outgas observed as peaks of 1, 2, 17, and 18 atomic mass units (i.e., H, $H_2$, $H_2O$, and OH, respectively) in a quadrupole mass spectrometer.

<Total Amount of Outgas>

The pellicle of the present disclosure has the total amount of aqueous outgas of $5.0 \times 10^{-4}$ Pa·L/sec or less in an atmosphere of 23° C. and $1 \times 10^{-3}$ Pa or less.

The total amount of the aqueous outgas is $5.0 \times 10^{-4}$ Pa·L/sec or less, and thus generation of radicals and the like can be suppressed, and the deterioration of the pellicle film can be suppressed.

From the above viewpoint, the total amount of the aqueous outgas is preferably $3.0 \times 10^{-4}$ Pa·L/sec or less, and more preferably $1.0 \times 10^{-4}$ Pa·L/sec or less.

The total amount of the aqueous outgas may be $1.0 \times 10^{-10}$ Pa·L/sec or more, $1.0 \times 10^{-5}$ Pa·L/sec or more, or $5.0 \times 10^{-6}$ Pa·L/sec or more.

A method of measuring the total amount of the aqueous outgas is as follows.

The total amount of the aqueous outgas in the present disclosure means the amount of released aqueous outgas in a state where the pellicle is pasted to a glass substrate.

First, a degree of vacuum B (Pa) of a chamber is measured while a pressure within a chamber of a pressure reduction (vacuum) device is reduced by a vacuum pump having an effective displacement A (L/sec). Using the above A and B, a total released gas amount is calculated from a relational expression of A×B (Pa·L/sec).

Next, a partial pressure of the amount of released gas in vacuum is calculated from an ion current value for each measurement mass using a quadrupole mass spectrometer (for example, "HAL441/3L" manufactured by Hiden Analytical). Then, proportions of the amount of released aqueous gas (1, 2, 17, and 18 amu) and the amount of released hydrocarbon-based gas (45 to 200 amu) are calculated from the ion current values, and the calculated proportions are multiplied by the total released gas amount to calculate the amounts of released aqueous gas and released hydrocarbon-based gas.

Examples of a vacuum chamber include a chamber of New Subaru BL-9C. A displacement of a vacuum pump in the BL-9C chamber is 297 L/sec. For example, when $N_2$ gas flows into the chamber, the displacement can be calculated from a graph slope of a chamber pressure and an introduced gas flow rate.

Specifically, the total amount of the aqueous outgas is measured by the following method.

A sample is inserted into a load lock chamber; gate valves of the load lock chamber and a main chamber are opened at a time point when the load lock chamber reaches $2\times10^{-4}$ Pa or less, so that the sample is inserted into the main chamber; and then the gate valves are closed.

Before the sample is inserted (that is, before the gate valves are opened), the main chamber has a degree of vacuum of $1\times10^{-3}$ Pa or less and a temperature of 23° C., and the amount of released aqueous outgas is determined by a degree of vacuum 15 minutes after start of pressure reduction and gas analysis with a quadrupole mass spectrometer.

Hereinafter, the pellicle according to the present disclosure will be described with reference to FIG. 1. FIG. 1 is a schematic cross-sectional view showing a pellicle 10 of the present disclosure. The pellicle 10 is configured by adhering a pellicle film 12 and a support frame 14 to each other via a film adhesive layer 13, and a vent hole 16 and an original plate adhesive layer 15 are formed in the support frame 14.

<Pellicle Film>

The pellicle of the present disclosure includes a pellicle film (also referred to as carbon-based pellicle film in the present disclosure) including a carbon-based film having a carbon content rate of 40 mass % or more.

Conventionally, it has been studied to use a carbon-based pellicle film under an exposure environment of EUV light.

The present inventors have found that hydrogen gas, moisture or the like present in an exposure atmosphere absorbs EUV light to be ionized, and hydrogen radicals, hydrogen ions, hydroxy radicals, oxygen radicals and the like (also referred to as radicals and the like) are generated, and that these radicals and the like oxidize the carbon-based pellicle film, so that the pellicle film is deteriorated.

Furthermore, the present inventors have found that the amount of outgas released mainly from the adhesive tends to be large as the outgas released from the pellicle.

Therefore, the present inventors have considered that it is important to reduce the amount of outgas from the adhesive constituting the pellicle.

Examples of the pellicle film including a carbon-based film having a carbon content rate of 40 mass % or more include pellicle films containing carbon nanotubes (also simply referred to as "CNT" in the present disclosure).

When connected to the support frame that supports the pellicle film, the carbon-based film having a carbon content rate of 40 mass % or more does not always require use of the adhesive. This is because the carbon-based film having a carbon content rate of 40 mass % or more can be connected to the support frame by van der Waals force without interposing the adhesive layer.

In the pellicle of the present disclosure, the amount of adhesive used can be reduced by using a pellicle film including a carbon-based film having a carbon content rate of 40 mass % or more. As a result, the total amount of aqueous outgas can be greatly reduced, and the deterioration of the pellicle film can be suppressed.

(Carbon-Based Film)

The pellicle film in the present disclosure includes a carbon-based film having a carbon content rate of 40 mass % or more.

The carbon content rate of the carbon-based film is 40 mass % or more, and thus a transmittance of EUV light can be increased.

From the above viewpoint, the carbon content rate of the carbon-based film is preferably 60 mass % or more, more preferably 80 mass % or more, still more preferably 90 mass % or more, and still more preferably 93 mass % or more.

The carbon content rate of the carbon-based film is measured by X-ray photoelectron spectroscopy (also abbreviated as XPS).

Since information obtained by XPS measurement is limited to composition information about a shallow region of several nm from a surface of a thin film, when a carbon-based pellicle film having a coating layer on the surface is measured, a composition of the coating layer may be mainly detected.

Therefore, when the carbon content rate of the carbon-based film is measured by XPS, composition analysis is performed while the pellicle film is etched by ion sputtering, and a carbon content rate is calculated from the total amount of a depth direction profile thereof.

Examples of the carbon-based film include a CNT film and a graphite film.

Among the above films, the carbon-based film is preferably a CNT film.

[CNT Film]

The CNT film is a film containing CNTs.

The carbon-based film is a CNT film, and thus good strength can be imparted to a pellicle film containing CNTs.

From the viewpoint of improving a light transmittance, a diameter of CNT tubes in the CNT film is preferably 0.8 nm or more and 400 nm or less, more preferably 2 nm or more and 100 nm or less, and still more preferably 4 nm or more and 100 nm or less.

The diameter of tubes in the carbon nanotubes refers to a diameter of single fibers when the tubes are present as the single fibers in the pellicle film, and refers to a diameter of a bundle when the tubes are present as a bundle of CNTs in the pellicle film.

The CNTs are not particularly limited, and may be single-walled CNTs or multi-walled CNTs.

When the CNTs are single-walled CNTs, a thickness of the bundle in the single-walled CNTs is preferably 4 nm to 400 nm, and more preferably 4 nm to 40 nm, from the viewpoint of improving the light transmittance.

When the CNTs are multi-walled CNTs, a thickness of the single fibers or a thickness of the bundle, in the multi-walled CNTs, is preferably 4 nm to 400 nm, and more preferably 4 nm to 100 nm, from the viewpoint of improving the light transmittance.

In the pellicle film of the present disclosure, the CNTs preferably form a nonwoven fabric shape.

Since the CNTs contained in the pellicle film of the present disclosure usually has a fiber shape, a nonwoven fabric shape can be formed as the entire pellicle film of the present disclosure.

Since the CNTs contained in the pellicle film form a nonwoven fabric shape, air permeability of the pellicle film can be secured.

For example, when exposure is performed using EUV light by an exposure device including a pellicle, it is required to irradiate the pellicle with EUV light under vacuum or reduced pressure conditions.

Usually, a vent hole is provided in the pellicle, and air inside the pellicle is removed from the vent hole to create a vacuum or reduced pressure environment, but which involves a problem that it takes time and effort to provide the vent hole.

In the pellicle film of the present disclosure, the CNTs form a nonwoven fabric shape, and thus air permeability can be secured by the nonwoven fabric shape, and a vacuum or reduced pressure environment can be easily created.

[Graphite Film]

A graphite film is a film made only of carbon.

The graphite film may be a film having a refractive index of 2.0 to 3.0 for light having a wavelength of 550 nm.

The graphite film may be a film having a monocrystalline structure or a film having a polycrystalline structure.

The graphite film having a monocrystalline structure is preferred in terms of high film strength and high thermal conductivity. On the other hand, the graphite film having a polycrystalline structure is easy to manufacture, and is preferred in terms of cost.

The graphite film can be a film formed by a known method. Examples of a method of forming a graphite film include a method in which high energy is applied to a polymer film such as polyoxadiazole, aromatic polyimide, aromatic polyamide, polybenzimidazole, polybenzobisthiazole, polybenzoxazole, polythiazole, polyacrylonitrile, or polyparaphenylenevinylene, and the polymer film is converted into graphite. A method of applying high energy is desirably a method of firing with high heat or a method of applying radiation.

The radiation to be applied can be an X-ray, a γ-ray, an electron beam, a neutron beam, an ion beam (heavy charged particle beam), or the like. When radiation is applied to the polymer film, the radiation interacts with a substance constituting the film, and energy is imparted to atoms in the film. This energy excites and ionizes atoms, emits secondary electrons, and causes various chemical reactions. As a result, the polymer film is carbonized to obtain a graphite film. Examples of a method of producing the graphite film include an arc discharge method using a carbon solid as a raw material, a plasma chemical vapor deposition (CVD) method using a hydrocarbon-based gas as a raw material, and a plasma jet method in vacuum using methane gas as a raw material.

The graphite film is preferably highly-oriented pyrolytic graphite (HOPG) obtained by forming a graphite film by the above-described method and then further re-annealing the formed graphite film at a high temperature for a long time while applying a pressure. The highly-oriented pyrolytic graphite obtained by re-annealing for a long time has a very small mosaic spread.

<Antioxidant Layer>

In the pellicle film of the present disclosure, another layer may be disposed.

The pellicle film of the present disclosure may further include an antioxidant layer on at least one side.

When the pellicle film further includes the antioxidant layer, oxidation of the pellicle film can be suppressed during light irradiation or pellicle storage.

The type of the antioxidant layer is not particularly limited as long as the antioxidant layer is a layer made of a material stable to light (preferably EUV light). For example, the antioxidant layer can be a layer made of $SiO_x$ ($x \leq 2$), $Si_xN_y$ (x/y is 0.7 to 1.5), SiON, $Y_2O_3$, YN, Mo, Ru, Rb, Sr, Y, Zr, Nb, or Rh.

In order not to inhibit light transmission, a thickness of the antioxidant layer is preferably approximately 1 nm to 10 nm, and more preferably approximately 2 nm to 5 nm. By setting the thickness of the antioxidant layer to approximately 1 nm to 10 nm, absorption of light by the antioxidant layer can be suppressed, and a decrease in transmittance can be suppressed.

A proportion of the thickness of the antioxidant layer to the thickness of the pellicle film is preferably in a range of 0.03 to 1.0. When the numerical range is employed, absorption of light by the antioxidant layer can be suppressed, and a decrease in transmittance can be suppressed.

In addition, when the antioxidant layer is disposed on the pellicle film, light is reflected at a newly generated layer interface, that is, an interface between the antioxidant layer and air and an interface between the antioxidant layer and the pellicle film, and there is a possibility that the transmittance may decrease. The light reflectance at the layer interface can be calculated according to the thicknesses of the pellicle film and the antioxidant layer and the types of elements constituting the pellicle film and the antioxidant layer. By optimizing the thicknesses of the films in the same manner as in the principle of the antireflection film, the reflectance can be decreased.

The thickness of the antioxidant layer is preferably an optimum thickness in a range where the antioxidant layer has antioxidation performance while a decrease in light transmittance due to absorption and a decrease in light transmittance due to reflection are suppressed.

Thickness uniformity and surface roughness of the antioxidant layer are also not particularly limited. The antioxidant layer may be either a continuous layer or a sea-island shape as long as non-uniformity of thickness or non-uniformity of transmittance derived from surface roughness, hindrance due to scattering of light, or the like does not occur in a patterning step of exposure. Also, the antioxidant layer may have non-uniform thickness or may have surface roughness.

An average refractive index of the pellicle film including the pellicle film and the antioxidant layer is preferably in a range of 1.9 to 5.0. The refractive index can be measured by a technique such as spectroscopic ellipsometry. An average density of the pellicle film including the pellicle film and the antioxidant layer is preferably in a range of 1.5 g/cm³ to 5.0 g/cm³. The density can be measured by a technique such as an X-ray reflection method.

The thickness of the pellicle film (total thickness in the case of two or more layers) can be, for example, 1 nm or more and 200 nm or less.

From the viewpoint of suppressing deterioration, due to damage, of the pellicle film, the thickness of the pellicle film (layer thickness in the case of two or more layers) is preferably 4 nm or more, more preferably 6 nm or more, still more preferably 10 nm or more, and particularly preferably 50 nm or more.

From the viewpoint of transmitting EUV energy, the thickness of the pellicle film (layer thickness in the case of two or more layers) is preferably 100 nm or less, more preferably 80 nm or less, and still more preferably 60 nm or less.

From these viewpoints, the thickness of the pellicle film (total thickness in the case of two or more layers) is preferably 4 nm or more and 100 nm or less, more preferably 6 nm or more and 80 nm or less, and still more preferably 10 nm or more and 60 nm or less.

[Measurement of Thickness of Pellicle Film]

A self-supported film portion of a pellicle film of a pellicle which will be described later is transferred onto a silicon substrate, and the thickness of the pellicle film is determined using a reflection spectrophotometer (F50-UV manufactured by Filmetrics Corporation). The self-supported film portion of the pellicle film refers to a region of the pellicle film that is not supported by the support frame.

Specifically, the film thickness is measured as follows.

<Transfer>

The self-supported film portion of the pellicle film of the pellicle which will be described later is transferred onto the silicon substrate.

Specifically, a solvent is dropped onto the silicon substrate, the pellicle film of the pellicle is made to face the silicon substrate, and the pellicle is placed on the substrate. Examples of the solvent include water and organic solvents. The solvent is dried to bring the pellicle film into close contact with the silicon substrate without any gap. The silicon substrate is fixed, and the pellicle frame of the pellicle is lifted up to separate the self-supported film portion from the pellicle, and the self-supported film portion is transferred to the substrate.

<Measurement of Reflection Spectrum>

For each measurement point of the self-supported film portion transferred to the silicon substrate, a reflectance spectrum in a wavelength range of 200 nm to 600 nm is measured in a wavelength interval range of 1 nm to 2 nm.

In the measurement of the reflectance spectrum, a reflection spectrophotometer (for example, model: F50-UV manufactured by Filmetrics Corporation, spot diameter: 1.5 mm) is used as a reflectance measurement device. A silicon wafer is used as a reference for reflection intensity measurement.

A reflectance Rs ($\lambda$) is determined by the following equation.

[Mathematical Formula 1]

$$Rs(\lambda) = \frac{I_S(\lambda)}{I_{ref}(\lambda)} R_{ref}(\lambda)$$

Here, Is ($\lambda$) represents reflection intensity of the self-supported film portion on the silicon substrate at a wavelength $\lambda$, Iref ($\lambda$) represents reflection intensity of the reference, and Rref ($\lambda$) represents an absolute reflectance of the reference.

When a silicon wafer is used as the reference, an optical constant of the silicon wafer is known, and thus Rref ($\lambda$) can be obtained by calculation. Note that, in the reflection intensity measurements of the reference and the self-supported film portion on the silicon substrate, the same conditions such as gain and exposure time are employed. Thus, an absolute reflectance of the self-supported film portion on the silicon substrate is obtained.

<Calculation of Film Thickness>

Using values of optical constants (refractive index: n, extinction coefficient: k) shown in Table 1 as the optical constants of the CNT film, and using a three-layer model of air layer/CNT film layer/silicon substrate, a reflectance spectrum in a wavelength range of 225 to 500 nm is analyzed by a least squares method to calculate the film thickness at each measurement point of the self-supported film portion.

The film thickness at a "measurement position" of the self-supported film portion is an average value of film thicknesses at nine measurement points included in the "measurement position" of the self-supported film portion. A shape of the self-supported film portion, when viewed from a film thickness direction of the self-supported film portion, is rectangular. Diagonal lines of the self-supported film portion are defined as an X-axis and a Y-axis. Three points at intervals at which a distance between center points of adjacent measurement points is 2 mm are set as measurement points in an X-axis direction, and three points at intervals at which a distance between center points of adjacent measurement points is 2 mm are set as measurement points in a Y-axis direction. That is, a total of nine measurement points of three vertical points x three horizontal points are set in the "measurement position".

A method of calculating the film thickness at each measurement point of the self-supported film portion by analyzing the reflectance spectrum in the wavelength range of 225 to 500 nm by the least squares method will be described below.

TABLE 1

| [nm] | n | k |
|---|---|---|
| 225 | 1.20 | 0.61 |
| 248 | 1.34 | 0.75 |
| 276 | 1.52 | 0.76 |
| 310 | 1.64 | 0.72 |
| 354 | 1.71 | 0.68 |
| 413 | 1.75 | 0.68 |
| 496 | 1.81 | 0.70 |

The film thickness of the self-supported film portion is calculated using a three-layer model of air layer/CNT film layer/silicon substrate and using relational expressions according to the following equations (a) to (c).

The reflectance Rs is expressed by the following equation (a) using an amplitude reflectance $r_s$.

[Mathematical Formula 2]

$$R_S = r_s \cdot r_s^* \tag{a}$$

In the above equation (a), * represents a complex conjugate.

The amplitude reflectance $r_s$ from the three layers of air layer/CNT film layer/silicon substrate is expressed by the following equation (b).

[Mathematical Formula 3]

$$r_s = (r_{01} + r_{12} \exp(-i\delta))/(1 + r_{01} r_{12} \exp(-i\delta)). \tag{b}$$

In the above equation (b), $r_{01}$ represents the amplitude reflectance from an interface between the air layer and the self-supported film portion, $r_{12}$ represents the amplitude reflectance from an interface between the self-supported film portion and the silicon substrate layer, and i represents an imaginary unit.

In the above equation (b), $\delta$ is a phase difference generated when light having the wavelength $\lambda$ reciprocates once in the film, and is expressed by the following equation (c).

[Mathematical Formula 4]

$$\delta = \left(\frac{4\pi}{\lambda}\right) Nd\cos\phi. \tag{c}$$

In the above equation (c), d represents the film thickness of the self-supported film portion, N represents a complex refractive index (N=n−ik), and φ represents an incident angle. Further, i represents an imaginary unit.

The film thickness of the self-supported film portion can be obtained by calculation by the least squares method using the relational expressions according to the above equations (a) to (c), with the film thickness d as a variable with respect to the reflectance Rs in the wavelength range of 225 to 500 nm.

The calculated film thickness at the "measurement position" of the self-supported film is regarded as the film thickness of the pellicle film.

[Physical Property of Pellicle Film]

(Heat Dissipation and Heat Resistance)

When, for example, EUV is used as the light for exposure, energy of the EUV is changed to heat through various relaxation processes. Therefore, the pellicle film is required to have heat dissipation and heat resistance.

Since the pellicle film of the present disclosure includes a carbon-based film having a carbon content rate of 40 mass % or more, it can have both heat dissipation and heat resistance, and there is little possibility that the pellicle film may be broken during EUV lithography.

Therefore, while a conventional pellicle film made of monocrystalline silicon involves problems of having low heat dissipation and being easily deformed or broken due to thermal damage during EUV light irradiation, an original plate can be reliably protected by using the pellicle film of the present disclosure.

Details of the reason why the carbon-based film has both heat dissipation and heat resistance are as described in Japanese Domestic Re-publication of PCT international application No. 2015/178250.

<Support Frame>

The pellicle of the present disclosure includes a support frame that supports the pellicle film.

As shown in FIG. 1, the support frame (pellicle frame) 14 is for supporting the pellicle film 12.

As shown in FIG. 1, the support frame 14 may have a region surrounded by the pellicle 10 and an original plate (not shown), and the vent hole 16 for making an atmospheric pressure in the EUV exposure device constant. As described above, even when the vent hole 16 is not provided, it is possible to create a vacuum environment and a reduced pressure environment as long as the pellicle film of the present disclosure has a nonwoven fabric shape and has air permeability. Examples of the pellicle film having a nonwoven fabric shape and air permeability include a pellicle film made of carbon nanotubes.

Since the exposure by EUV light is performed under a vacuum environment (reduced pressure environment), when the atmospheric pressure at the time of exposure is non-uniform, the pellicle film 12 may expand and contract or be broken due to a pressure difference. A filter is preferably disposed in the vent hole 16 so that foreign matter does not enter the region surrounded by the pellicle 10 and the original plate.

Examples of the filter include an ultra low penetration air (ULPA) filter and a metal mesh. The support frame 14 may be colored for easy inspection as long as it does not interfere with exposure.

A material, a shape, and the like of the support frame are not particularly limited as long as it is a frame capable of supporting the pellicle film of the present disclosure.

The support frame may contain, as a material, aluminum, titanium, stainless steel, a ceramic-based material (for example, silicon, glass, or the like), or a resin such as polyethylene.

Among the above materials, the support frame preferably contains, as a material, aluminum, titanium, stainless steel, silicon, or glass, and more preferably contains aluminum, titanium, or silicon, from the viewpoint that it does not have a high content of water and can suppress the amount of outgas.

The support frame may include a first support frame that supports the pellicle film and a second support frame connected to the first support frame.

When the support frame includes the first support frame and the second support frame, the first support frame and the second support frame may be adhered to each other via an adhesive layer.

For example, in the present disclosure, the pellicle including the support frame having a configuration in which the second support frame is connected to the first support frame may be manufactured in cooperation by a plurality of persons who manufacture the first support frame that supports the pellicle film and persons who connect the second support frame to the first support frame.

The pellicle of the present disclosure also includes a configuration including the pellicle film and the first support frame before being connected to the second support frame.

From the viewpoint that the support frame does not have a high content of water and can suppress the amount of outgas, the support frame is preferably subjected to a treatment for making the surface hydrophobic, and also the surface is preferably coated using a material which does not have a high content of water (for example, an inorganic material, a ceramic-based material, or the like).

A procedure and a method of fixing the pellicle film to the support frame are not particularly limited. The etched substrate may also be used as a part of the support frame. For example, the pellicle film may be disposed on a substrate that can be removed by a specific treatment method, such as a metal, a silicon substrate, glass, a resin, or a salt, and, thereafter, a mask may be applied to a substrate surface opposite to an arrangement surface of the pellicle film in accordance with a size of the frame, and etching or dissolution may be performed while a mask shape is left. Thus, a pellicle in which a part of the substrate is used as the support frame can be obtained.

A trimming method of matching the shape of the substrate with the frame shape is not particularly limited. When a silicon substrate is used, a method of mechanically splitting a wafer or a laser trimming method can be used.

<Adhesive Layer>

The pellicle of the present disclosure includes an adhesive layer containing an adhesive.

Examples of an aspect of the adhesive layer include (a) to (c) below:

(a) an adhesive layer for adhering the support frame and the original plate (also referred to as original plate adhesive layer);

(b) in a case where a plurality of support frames are present, an adhesive layer for adhering the support frames to each other (also referred to as support frame adhesive layer); and (c) an adhesive layer for adhering the pellicle film and the support frame (also referred to as film adhesive layer).

As described above, in the present disclosure, the film adhesive layer (c) is not necessarily provided.

This is because the carbon-based film having a carbon content rate of 40 mass % or more in the present disclosure can be connected to the support frame by van der Waals force without interposing the adhesive layer.

[Original Plate Adhesive Layer]

The original plate adhesive layer 15 is a layer that adheres the support frame 14 and the original plate to each other. As shown in FIG. 1, the original plate adhesive layer 15 is provided at an end portion of the support frame 14 on a side where the pellicle film 12 is not fixed. The original plate adhesive layer 15 is, for example, a double-sided pressure-sensitive adhesive tape, a silicone resin pressure-sensitive adhesive, an acrylic pressure-sensitive adhesive, a poly-olefin pressure-sensitive adhesive, an inorganic adhesive, or the like. From the viewpoint of retaining the degree of vacuum at the time of EUV exposure, the original plate adhesive layer 15 preferably contains a small amount of outgas. As a method of evaluating the outgas, for example, a thermal desorption gas analyzer can be used.

[Film Adhesive Layer]

The film adhesive layer 13 is a layer that adheres the support frame 14 and the pellicle film 12 to each other. The film adhesive layer 13 can be a layer made of, for example, an acrylic resin adhesive, an epoxy resin adhesive, a poly-imide resin adhesive, a silicone resin adhesive, an inorganic adhesive, or the like. From the viewpoint of retaining the degree of vacuum at the time of EUV exposure, the film adhesive layer 13 preferably contains a small amount of outgas. As a method of evaluating the outgas, for example, a thermal desorption gas analyzer can be used.

In addition, a method of fixing the pellicle film to the support frame is not particularly limited, and the pellicle film may be directly bonded to the support frame, the pellicle film may be fixed to the support frame via the film adhesive layer on one end surface of the support frame, or the pellicle film and the support frame may be fixed by a mechanical fixing method or using an attractive force of a magnet or the like.

As a method of evaluating adhesiveness between the pellicle film and the support frame, for example, a technique of evaluating the presence or absence of breakage or peeling of the film by air blowing while changing pressure, area, distance, and angle, a technique of evaluating the presence or absence of breakage or peeling of the film by a vibration test while changing acceleration and amplitude, or the like can be used.

Since the film adhesive layer 13 and the original plate adhesive layer 15 are exposed to EUV light scattered in an EUV exposure device, they preferably have EUV resistance. Low EUV resistance reduces the adhesiveness and strength of the adhesives during EUV exposure, and defects such as peeling of the adhesives and generation of foreign matters occur in the exposure device. For the resistance evaluation by EUV light irradiation, for example, a technique of composition analysis such as XPS measurement, EDS analysis, or RBS, a technique of structural analysis such as XPS, EELS, IR measurement, or Raman spectroscopy, a thickness evaluation method such as ellipsometry, interfer-ence spectroscopy, or X-ray reflection method, an appear-ance or surface shape evaluation method such as micros-copy, SEM observation, or AFM observation, a strength and adhesiveness evaluation method by a nanoindenter or a peeling test, and the like can be used.

In lithography, it is necessary for a circuit pattern to be accurately transferred. Therefore, it is necessary that the transmittance of the exposure light be substantially uniform in the exposure range. By using the pellicle film 12 of the present disclosure, the pellicle 10 having a constant light transmittance in an exposure range is obtained.

(Adhesive)

The adhesive contained in the adhesive layer is not particularly limited.

Examples of the adhesive include an acrylic resin adhe-sive, an epoxy resin adhesive, a polyimide resin adhesive, a silicone resin adhesive, an inorganic adhesive, a double-sided adhesive tape, a polyolefin-based adhesive, and a hydrogenated styrene-based adhesive.

Among the above adhesives, the adhesive is preferably at least one selected from the group consisting of a silicone resin adhesive, an acrylic resin adhesive, a hydrogenated styrene-based adhesive, and an epoxy resin adhesive from the viewpoint of ease of application processing and ease of curing processing treatment.

Among the above adhesives, the adhesive is more pref-erably at least one selected from the group consisting of a silicone-based adhesive, an acrylic resin adhesive, and a hydrogenated styrene-based adhesive from the viewpoint of reducing the amount of released aqueous outgas.

Among the above adhesives, the adhesive is still more preferably an acrylic resin adhesive from the viewpoint of reducing the amount of released hydrocarbon-based outgas and suppressing contamination in the device.

In the present disclosure, the adhesive is a concept includ-ing not only the adhesive but also a pressure-sensitive adhesive.

A moisture content rate of the adhesive layer is preferably 2.00 mass % or less, more preferably 1.00 mass % or less, still more preferably 0.80 mass % or less, particularly preferably 0.70 mass % or less, and most preferably 0.50 mass % or less from the viewpoint of reducing the amount of the aqueous outgas released from the pellicle which may affect the deterioration and damage of the carbon-based pellicle film.

A lower limit of the moisture content rate is not particu-larly limited, and can be, for example, 0.01 mass % or more, and may be 0.10 mass % or more, or 0.30 mass % or more.

From the above, the moisture content rate of the adhesive layer is preferably 0.01 mass % to 2.00 mass %, more preferably 0.10 mass % to 2.00 mass %, and still more preferably 0.10 mass % to 1.00 mass %.

The water content rate of the adhesive layer is determined from a weight reduction rate when a test piece having a size of width 2.5 cm x length 4 cm is cut out from the adhesive layer formed on the surface of the support frame, and the test piece is heated from 25° C. to 200° C. at a temperature rise rate of 10° C./min using a thermogravimetric device.

The cutting-out of the test piece may be performed before the support frame is adhered to the original plate or the pellicle film, or may be performed after the adhesion.

The cutting-out of the test piece after the adhesion is performed by peeling the original plate or the pellicle film from the support frame and cutting out the adhesive layer formed on the support frame.

The adhesive layer is preferably subjected to a treatment for suppressing the contained moisture, from the viewpoint of suppressing the aqueous outgas to suppress the deterio-ration of the pellicle film.

Examples of the treatment include a treatment in which the adhesive is left to stand in vacuum for 24 hours or longer to reduce the moisture contained in the adhesive, and a treatment of applying a coating to the adhesive layer.

A method of applying a coating to the adhesive layer is not particularly limited, but any method by which a coating can be formed on a surface of the adhesive layer may be used. Examples of the method include vapor deposition and sputtering.

The pellicle of the present disclosure may further include a separator disposed in contact with the adhesive layer. By virtue of this, it is possible to store the pellicle while maintaining the adhesiveness of the adhesive layer until the original plate and the support frame are adhered to each other via the adhesive layer.

When a closed space as in a pellicle is formed, diffusion of gas molecules to the outside of the pellicle is inhibited by the presence of the pellicle film, and thus a gas concentration inside the pellicle is higher than that outside the pellicle. Then, the outgas released from the adhesive layer inside the pellicle deteriorates the pellicle film.

A surface area of the adhesive layer inside the pellicle is preferably 5.0 $cm^2$ or less, more preferably 2.5 $cm^2$ or less, still more preferably 1.0 $cm^2$ or less, and particularly preferably 0.5 $cm^2$ or less, from the viewpoint of suppressing the aqueous outgas to suppress the deterioration of the pellicle film.

A lower limit of the surface area of the adhesive layer inside the pellicle is preferably 0.03 $cm^2$ or more, more preferably 0.2 $cm^2$ or more, still more preferably 0.55 $cm^2$ or more, and particularly preferably 0.8 $cm^2$ or more from the viewpoint of reducing load at the time of sticking the adhesive layer to the photomask to reduce distortion of the photomask.

The surface area of the adhesive layer inside the pellicle is preferably 0.03 $cm^2$ to 2.5 $cm^2$, more preferably 0.05 $cm^2$ to 0.5 $cm^2$ from the viewpoint of suppressing the outgas, and still more preferably 0.55 $cm^2$ to 2.5 $cm^2$ from the viewpoint of reducing the load at the time of sticking the adhesive layer to the photomask to reduce distortion of the photomask.

The surface area of the adhesive layer is a value obtained by multiplying the thickness of the adhesive layer by an outer circumference of the adhesive layer.

Here, the surface area of the adhesive layer of the pellicle refers to a surface area of a region where the adhesive layer is exposed to the inside and the outside of the pellicle.

In addition, the surface area of the adhesive layer inside the pellicle refers to a surface area of a region where the adhesive layer is exposed to inside of the pellicle.

That is, the surface where the adhesive layer is in contact with the pellicle frame and the photomask is not included in the surface areas of the pellicle and the adhesive layer inside the pellicle.

This is because the outgas generated from the adhesive is generated from a portion exposed to the inside and the outside of the pellicle, and the outgas is not released to the outside from a region of the adhesive in contact with the pellicle frame and a region in contact with the photomask.

Therefore, for example, when the adhesive is applied along the entire circumference of the pellicle and the length of the entire circumference is 50 cm, the surface area of the adhesive layer is proportional to the thickness of the adhesive layer.

When the adhesive is applied along the entire circumference of the pellicle, for example, the thickness of the adhesive layer may be 1 μm or more and 1 mm or less, preferably 5 μm to 500 μm, and more preferably 10 to 300 μm. The thickness of the adhesive layer is preferably 110 μm to 500 μm, and more preferably 150 μm to 300 μm from a viewpoint of reducing the load at the time of sticking the adhesive layer to the photomask to reduce distortion of the photomask.

(Application of Pellicle)

The pellicle of the present invention may be used not only as a protective member for suppressing adhesion of foreign matter to the original plate in the EUV exposure device, but also as a protective member for protecting the original plate during storage of the original plate or transportation of the original plate. For example, if the pellicle is attached to the original plate (exposure original plate), the original plate can be stored as it is after being removed from the EUV exposure device. Examples of the method of attaching the pellicle to the original plate include a method of bonding the pellicle with an adhesive, an electrostatic adsorption method, and a method of mechanically fixing the pellicle.

The pellicle of the present disclosure is suitably used for exposure using exposure light having a short wavelength (for example, EUV light, light having a wavelength shorter than that of EUV light, and the like).

Among the above, the pellicle film of the present disclosure is suitably used for exposure using EUV light.

In the present disclosure, extreme ultra violet (EUV) light refers to light having a wavelength of 5 nm or more and 30 nm or less.

The wavelength of the EUV light is preferably 5 nm or more and 13.5 nm or less.

In the present disclosure, EUV light and light having a wavelength shorter than that of EUV light are collectively referred to as "EUV light or the like" in some cases.

[Modification]

As a modification of the pellicle of the present disclosure, a pellicle film forming a pellicle may have an antioxidant layer disposed on both surfaces of the film.

When the antioxidant layer is disposed on the pellicle film, oxidation of the pellicle film is suppressed during EUV light irradiation or pellicle storage. The antioxidant layer may be disposed only on one side of the pellicle film.

<<Method of Manufacturing Pellicle>>

A method of manufacturing a pellicle of the present disclosure (hereinafter simply referred to as method of manufacturing a pellicle) includes: a step of preparing a carbon-based material having a carbon content rate of 40 mass % or more (also referred to as preparation step); a step of forming a film of the carbon-based material in a sheet shape to manufacture a pellicle film (also referred to as sheet manufacture step); a step of connecting the pellicle film to a support frame so as to cover an opening of the support frame having the opening (also referred to as support frame connection step); and a step of forming an adhesive layer by applying an adhesive to a surface of the support frame in an opening on a side opposite to a side to which the pellicle film is connected (also referred to as adhesive layer formation step).

<Preparation Step>

The preparation step is a step of preparing a carbon-based material having a carbon content rate of 40 mass % or more.

The carbon-based material contained in the pellicle of the present disclosure may be CNTs.

The CNTs contained in the pellicle of the present disclosure may be commercially available, or may be manufactured and obtained.

As the CNTs, CNTs formed on a chemical vapor deposition substrate by a chemical vapor deposition (CVD) method in which a metal catalyst is caused to exist in a reaction system and an oxidant is added to a reaction atmosphere are preferably used.

As a CVD method, for example, a plasma CVD method is used, but a low-pressure CVD method or a thermal CVD method may also be used.

At this time, water vapor is used as the oxidant. A concentration of water vapor may be 10 ppm or more and 10,000 ppm or less, and water vapor may be added under a temperature environment of 600° C. or higher and 1000° C. or lower.

In addition, CNTs may be synthesized by disposing or patterning a metal catalyst on a chemical vapor deposition substrate.

The resulting CNTs may be a single layer or a multilayer, or may be CNTs erected in a direction perpendicular to a surface of the chemical vapor deposition substrate.

Specifically, the CNTs can be manufactured with reference to, for example, International Publication No. WO 2006/011655.

Examples of commercially available products of such CNTs include CNTs manufactured by a super-growth method sold by Zeon Corporation.

As the CNTs (which may be CNT bulk structures), CNTs manufactured by enhanced direct injection pyrolytic synthesis (hereinafter referred to as e-DIPS method) is preferably used.

The direct injection pyrolytic synthesis (hereinafter referred to as DIPS method) is a gas phase flow method in which a hydrocarbon-based solution containing a catalyst (or a catalyst precursor) and a reaction accelerator is atomized by spraying and introduced into a high-temperature heating furnace to synthesize single-layer CNTs in a flowing gas phase.

The e-DIPS method obtained by improving the DIPS method is a method focusing on a particle formation process in which ferrocene used in a catalyst has different particle diameters on upstream and downstream sides in a reaction furnace, in which a growth point of single-layer CNTs is controlled by mixing a second carbon source which is relatively easily decomposed in a carrier gas, i.e., which is likely to be a carbon source, unlike the DIPS method in which only an organic solvent is used as a carbon source.

In particular, they can be manufactured with reference to Saito et al., J. Nanosci. Nanotechnol., 8 (2008) 6153-6157.

Examples of commercially available products of such CNTs include trade name: "MEIJO eDIPS" manufactured by Meijo Nano Carbon Co., Ltd.

<Sheet Manufacture Step>

The sheet manufacture step is a step of forming a film of the carbon-based material in a sheet shape to manufacture a pellicle film.

The method of forming a film of the carbon-based material in a sheet shape is not particularly limited, and, for example, a method of forming a film of the carbon-based material in a sheet shape on a substrate may be used.

For example, a case where CNTs are used as the carbon-based material will be described.

CNTs (or CNT bulk structures) obtained by the CVD method, the e-DIPS method, or the like can be used in a state of being dispersed in a solvent.

A liquid (dispersion liquid) in which CNTs (or CNT bulk structures) are dispersed is applied onto the substrate, and the solvent is evaporated and removed to form a CNT film on the substrate.

In this case, by removing the solvent used in the dispersion liquid, a film in which CNTs are substantially parallel to the surface of the substrate is obtained.

The application method is not particularly limited, and may be, for example, spin coating, dip coating, bar coating, spray coating, electrospray coating, or the like.

Incidentally, the metal catalyst used in CNT formation may cause a decrease in EUV transmittance, but has no influence because, when CNTs are peeled from the chemical vapor deposition substrate, the CNTs contain almost no metal catalyst.

As the substrate, an inorganic material may be used.

For example, silicon (Si) may be used in the substrate. The substrate is not limited to silicon (Si), and may be a semiconductor material such as germanium (Ge), silicon germanium (SiGe), silicon carbide (SiC), or gallium arsenide (GaAs), or may be a glass substrate such as a quartz glass substrate (silicon oxide ($SiO_2$)), a soda glass substrate, a borosilicate glass substrate, or a sapphire substrate, silicon nitride (SiN), an aluminum nitride (AlN) substrate, a zirconia ($ZrO_2$) substrate, aluminum oxide ($Al_2O_3$), or the like.

In addition, from the viewpoint of reducing thermal strain with the CNT film, the substrate preferably contains at least any of silicon, sapphire, and silicon carbide having a linear thermal expansion coefficient close to that of the pellicle film.

The silicon (Si) may be any of monocrystalline silicon, polycrystalline silicon, microcrystalline silicon, and amorphous silicon, but monocrystalline silicon is preferred from the viewpoint of etching efficiency, high versatility and low cost.

A shape of the substrate may be circular or rectangular.

A thickness of the substrate is not particularly limited, but is preferably 100 μm or more and 1000 μm or less, and preferably 200 μm or more and 1000 μm or less from the viewpoint of handling.

<Support Frame Connection Step>

The support frame connection step is a step of connecting the pellicle film to a support frame so as to cover an opening of the support frame having the opening.

In the support frame connection step, after the above-mentioned pellicle film and the substrate are separated from each other, the separated pellicle film may be connected to the support frame (that is, pellicle frame).

A method of separating the pellicle film and the substrate from each other is not particularly limited, and examples thereof include the following manufacture examples.

(Method of Laminating Sacrificial Layer on Substrate and then Removing the Sacrificial Layer)

A sacrificial layer is disposed on a substrate, a pellicle film is formed on the sacrificial layer, and the sacrificial layer is removed later to obtain a self-supported film.

The sacrificial layer can be made of a metal, an oxide film, a resin, a salt, or the like that can be removed by a specific treatment method. For example, the sacrificial layer can be made of a metal such as aluminum that is soluble in an acidic solution. Specifically, a metal layer is disposed on a surface of a glass substrate or a silicon substrate by vapor deposition, sputtering, or the like, a pellicle film is further disposed on the metal layer, and then the laminated body is immersed in a solution capable of dissolving the metal layer, such as an acidic solution, thereby the film can be peeled from the substrate.

When a silicon substrate having a natural oxide film or a silicon oxide layer is used as the substrate, a pellicle film is coated on the natural oxide film or the silicon oxide layer on the silicon substrate, and the pellicle film-coated substrate is then immersed in an aqueous hydrofluoric acid solution to remove the natural oxide film or the silicon oxide layer, and to peel the pellicle film from the substrate.

The sacrificial layer to be disposed on the substrate may be a water-soluble material such as a partially saponified polyvinyl alcohol resin or a salt such as sodium chloride.

After the pellicle film is disposed on the sacrificial layer, the film can be peeled from the substrate by immersing the laminated body in water.

In selecting the method of removing the sacrificial layer disposed on the substrate, the most appropriate arbitrary technique can be selected according to characteristics such as process resistance of the pellicle film, film strength, removal speed of the sacrificial layer, and thickness uniformity and surface roughness of the sacrificial layer.

(Method of Etching or Dissolving Substrate)

In a case where a material for the substrate is metal, an oxide film, resin, salt, or the like, which can be removed by a specific treatment method, a film can be obtained by laminating a pellicle film on the substrate and then etching or dissolving the substrate.

For example, when a copper foil is used as the substrate, a pellicle film is disposed on a surface of the copper foil, and the laminated body is then immersed in a cupric chloride etching solution to etch the copper foil substrate to remove the substrate, thereby a film can be obtained.

When the substrate is a glass substrate, a pellicle film is disposed on the glass substrate, and then the glass substrate is etched using hydrofluoric acid to remove the substrate, thereby a film can be obtained.

When the substrate is a silicon substrate, a pellicle film is disposed on the silicon substrate, and then the silicon substrate is etched by wet etching or dry etching to remove the silicon substrate, thereby a film can be obtained.

For the wet etching, an etching liquid such as KOH, TMAH, or hydrazine can be used. For the dry etching, an etching gas such as a fluorine-based etching gas ($SF_6$, $CF_4$, $NF_3$, PFS, $BF_3$, $CHF_3$, $XeF_2$, $F_2+NO$), a chlorine-based etching gas ($Cl_2$, $SiCl_4$), or a bromine-based etching gas (IBr) can be used. Since a wet etching rate varies depending on the temperature, it is preferable to lower a liquid temperature and to lower the etching rate in order to perform etching so as not to damage a thin film containing CNTs on the silicon substrate.

When the silicon substrate is dry-etched, a layer such as an etching stop layer may be provided on the silicon substrate surface in advance.

Examples of the etching stop layer include a layer made of $SiO_2$ or SiN. The etching stop layer is preferably formed of a film that generates a tensile stress.

Residual stresses acting in a direction parallel to the surfaces of the substrate and the thin film include a tensile stress and a compressive stress. When a force for expanding the thin film acts within the thin film, the tensile stress is generated. On the other hand, when a force for contracting the thin film acts within the thin film, the compressive stress is generated. These stresses are mainly generated in a process of forming the thin film.

One of factors causing the residual stresses is a difference in thermal expansion coefficient between the substrate and the thin film. When the temperature is returned to room temperature, both the substrate and the thin film contract, but proportions thereof vary depending on the thermal expansion coefficient. When the thermal expansion coefficient of the thin film is larger than the thermal expansion coefficient of the substrate, the tensile stress is generated, and when the thermal expansion coefficient of the thin film is smaller than the thermal expansion coefficient of the substrate, the compressive stress is generated. The film in which the tensile stress is generated is preferred because tension is applied to the pellicle film provided on the film to form a film without wrinkles. Since the layer made of SiN generates the tensile stress, the pellicle film obtained by dry etching the silicon substrate can be a wrinkle-free film. The etching stop layer is removed after the dry etching of the silicon substrate is completed, thereby a target self-supported film can be obtained.

When the substrate is a substrate made of a salt such as sodium chloride, a pellicle film is disposed on the surface of the substrate, and the laminated body is then immersed in water to etch the substrate to remove the substrate, thereby a film can be obtained.

When the substrate is a plastic substrate, a pellicle film is disposed on the surface of the plastic substrate, and then the plastic substrate is immersed in a solvent in which it is soluble, so that the plastic substrate can be dissolved to obtain a film.

(Method of Pre-Treating Surface of Substrate for Easy Peeling)

By subjecting the substrate to surface treatment, an interaction between the pellicle film and the substrate surface can be controlled, and the film can be easily peeled from the substrate by immersion in a solvent or a mechanical peeling process.

Examples of a method of controlling the interaction between the pellicle film and the substrate surface include a surface treatment method using a silane coupling agent. Other examples of the method include a method of washing the substrate surface with water, an organic solvent, a piranha solution, sulfuric acid, UV ozone treatment, or the like.

When the substrate is a silicon substrate, a solution used in an RCA cleaning method, such as a mixed liquid of hydrogen peroxide water and ammonium hydroxide or a mixed liquid of hydrochloric acid and hydrogen peroxide water, can be used.

A method of etching or dissolving the substrate may be used in combination with each of the formation of the sacrificial layer and the surface treatment on the substrate. The substance for use in the formation of the sacrificial layer or the surface treatment is preferably a substance which hardly remains on the surface, inside, or the like of the pellicle film, and, even if remaining, can be removed by an easy method.

For example, examples of the method include etching by gas, evaporation by heat, washing with a solvent, and removal through decomposition by light, and these methods may be combined to perform removal.

<Adhesive Layer Formation Step>

The adhesive layer formation step is a step of forming an adhesive layer by applying an adhesive to a surface of the support frame in an opening on a side opposite to a side to which the pellicle film is connected.

As a result, the original plate such as a photomask and the support frame can be adhered to each other via the adhesive layer.

A separator may be disposed so as to be in contact with a surface of the formed adhesive layer opposite to the support frame. By virtue of this, it is possible to store the pellicle while maintaining the adhesiveness of the adhesive layer until the original plate and the support frame are adhered to each other via the adhesive layer.

<Exposure Original Plate>

An exposure original plate of the present disclosure includes:

an original plate having a pattern; and the pellicle of the present disclosure attached to a surface of the original plate having a pattern.

The exposure original plate of the present disclosure includes the pellicle of the present disclosure, and thus provides the same effect as that of the pellicle of the present disclosure.

A method of attaching the original plate to the pellicle of the present disclosure is not particularly limited. For example, the original plate may be directly bonded to the support frame, the original plate may be fixed to the support frame via the original plate adhesive layer on one end surface of the support frame, or the original plate and the support frame may be fixed by a mechanical fixing method or using an attractive force of a magnet or the like.

Here, as the original plate, an original plate including a support substrate, a reflection layer disposed on the support substrate, and an absorbent layer formed on the reflection layer can be used. When the absorbent layer partially absorbs light (for example, EUV light), a desired image is formed on a sensitive substrate (for example, a semiconductor substrate with a photoresist film). The reflection layer may be a multilayer film of molybdenum (Mo) and silicon (Si). The absorbent layer may be a material having high absorbability of EUV light or the like, such as chromium (Cr) or tantalum nitride.

<Exposure Device>

An exposure device of the present disclosure includes the above-described exposure original plate.

More specifically, the exposure device of the present disclosure includes: a light source that emits exposure light; the exposure original plate of the present disclosure; and an optical system that guides the exposure light emitted from the light source to the exposure original plate, and the exposure original plate is disposed such that the exposure light emitted from the light source permeates the pellicle film and is applied to the original plate.

Therefore, the exposure device of the present disclosure has the same effect as that of the exposure original plate of the present disclosure.

Preferably, the exposure device of the present disclosure includes: a light source that emits exposure light; the exposure original plate of the present disclosure; and an optical system that guides the exposure light emitted from the light source to the exposure original plate, and the exposure original plate is disposed such that the exposure light emitted from the light source permeates the pellicle film and is applied to the original plate.

According to this aspect, it is possible to form a pattern (for example, a line width of 32 nm or less) made fine by EUV light or the like, and also to perform pattern exposure in which resolution failure due to foreign matter is reduced even in a case of using EUV light in which resolution failure due to foreign matter tends to be a problem.

The Exposure Light in the Present Disclosure is Preferably EUV Light.

<Method of manufacturing semiconductor device>

A method of manufacturing a semiconductor device includes of the present disclosure includes: a step of allowing exposure light emitted from a light source to permeate the pellicle film of the exposure original plate of the present disclosure to apply the exposure light to the original plate, and reflecting the exposure light on the original plate; and a step of allowing the exposure light reflected by the original plate to permeate the pellicle film and applying the exposure light to a sensitive substrate, thereby exposing the sensitive substrate to light in a pattern shape.

According to the method of manufacturing a semiconductor device of the present disclosure, it is possible to manufacture a semiconductor device in which resolution failure due to foreign matter is reduced even in a case of using EUV light in which resolution failure due to foreign matter is likely to be a problem.

Hereinafter, an example of the method of manufacturing a semiconductor device according to the present disclosure will be described with reference to FIG. 2.

Figure 2:
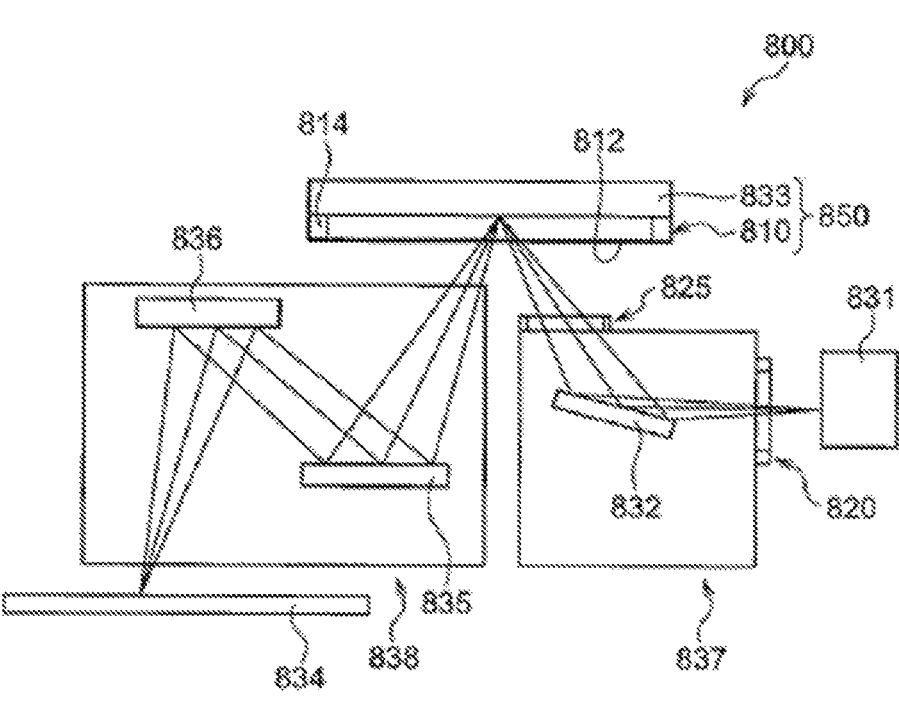
FIG. 2 is a schematic cross-sectional view of an EUV exposure device which is an example of an exposure device of the present disclosure.

FIG. 2 is a schematic cross-sectional view of an EUV exposure device 800 which is an example of the exposure device of the present disclosure.

As illustrated in FIG. 2, the EUV exposure device 800 includes a light source 831 that emits EUV light, an exposure original plate 850 that is an example of the exposure original plate of the present disclosure, and an illumination optical system 837 that guides the EUV light emitted from the light source 831 to the exposure original plate 850.

The exposure original plate 850 includes a pellicle 810 including a pellicle film 812 and a support frame 814, and an original plate 833. The exposure original plate 850 is disposed such that the EUV light emitted from the light source 831 permeates the pellicle film 812 and is applied to the original plate 833.

The original plate 833 reflects the irradiated EUV light in a pattern shape.

The support frame 814 and the pellicle 810 are examples of the support frame and the pellicle of the present disclosure, respectively.

In the EUV exposure device 800, filter windows 820 and 825 are installed between the light source 831 and the illumination optical system 837 and between the illumination optical system 837 and the original plate 833, respectively.

In addition, the EUV exposure device 800 includes a projection optical system 838 that guides the EUV light reflected by the original plate 833 to the sensitive substrate 834.

In the EUV exposure device 800, the EUV light reflected by the original plate 833 is guided onto the sensitive substrate 834 through the projection optical system 838, and the sensitive substrate 834 is exposed in a pattern shape. Exposure by EUV is performed under reduced pressure conditions.

The EUV light source 831 emits EUV light toward the illumination optical system 837.

The EUV light source 831 includes a target material, a pulse laser irradiation unit, and the like. EUV is obtained by irradiating the target material with a pulse laser to generate plasma. When the target material is Sn, EUV having a wavelength of 13 nm to 14 nm is obtained. The wavelength of the light emitted from the EUV light source is not limited to 13 nm to 14 nm, and may be light having a wavelength suitable for the purpose within a wavelength range of 5 nm to 30 nm.

The illumination optical system 837 collects the light emitted from the EUV light source 831, uniformizes an illuminance, and irradiates the original plate 833 with the light.

The illumination optical system 837 includes a plurality of multilayer film mirrors 832 for adjusting an optical path of EUV, an optical coupler (optical integrator), and the like. The multilayer film mirror is a multilayer film or the like in which molybdenum (Mo) and silicon (Si) are alternately disposed.

A method of attaching the filter windows 820 and 825 is not particularly limited, and examples thereof include a method of bonding the filter windows via an adhesive or the like, and a method of mechanically fixing the filter windows in the EUV exposure device.

The filter window 820 disposed between the light source 831 and the illumination optical system 837 captures scattering particles (debris) generated from the light source, and prevents the scattering particles (debris) from adhering to an element (for example, the multilayer film mirror 832) inside the illumination optical system 837.

On the other hand, the filter window 825 disposed between the illumination optical system 837 and the original plate 833 captures particles (debris) scattering from the light source 831 side, and prevents the scattering particles (debris) from adhering to the original plate 833.

In addition, since the foreign matter adhered to the original plate absorbs or scatters the EUV light, resolution failure to the wafer is caused. Therefore, the pellicle 810 is attached so as to cover the EUV light irradiation area of the original plate 833. The EUV light passes through the pellicle film 812 and is applied to the original plate 833.

The EUV light reflected by the original plate 833 passes through the pellicle film 812 and is applied to the sensitive substrate 834 through the projection optical system 838.

The projection optical system 838 condenses the light reflected by the original plate 833 and irradiates the sensitive substrate 834 with the light. The projection optical system 838 includes a plurality of multilayer film mirrors 835 and 836 for preparing an optical path of EUV.

The sensitive substrate 834 is a substrate or the like in which a resist is applied onto a semiconductor wafer, and the resist is cured in a pattern shape by the EUV reflected by the original plate 833. By developing this resist and etching the semiconductor wafer, a desired pattern is formed on the semiconductor wafer.

The pellicle 810 is attached to the original plate 833 via an original plate adhesive layer or the like. Since the foreign matter adhered to the original plate absorbs or scatters EUV, resolution failure to the wafer is caused. Therefore, the pellicle 810 is attached so as to cover the EUV light irradiation area of the original plate 833, and the EUV passes through the pellicle film 812 and is applied to the original plate 833.

A method of attaching the pellicle 810 to the original plate 833 may be any method as long as the pellicle can be installed on the original plate so that foreign matter does not adhere to the surface of the original plate, and examples thereof include a method of bonding the support frame 814 and the original plate 833 with an adhesive, an electrostatic adsorption method, and a mechanical fixing method, but are not particularly limited thereto. Preferably, a method of bonding them with an adhesive is used.

EXAMPLES

Hereinafter, the present disclosure will be described in more detail with reference to examples and the like, but the invention of the disclosure is not limited only to these examples.

In the present examples, the surface area of the adhesive layer, the total amount of aqueous outgas, and the carbon content rate of the carbon-based film were measured by the above-described methods.

Experimental Example

—Relationship Between Water Partial Pressure and Deterioration of CNT Film—

As described below, an experiment demonstrating the relationship between the water partial pressure and the deterioration of the CNT film was conducted.

Experimental Examples 1 to 4

<Production of CNT Film>

First, a CNT film as a pellicle film was produced.

As crude CNTs containing aggregates, single-layer CNTs (crude CNTs, trade name: EC1.5-P manufactured by Meijo Nano Carbon Co., Ltd, tube diameter: 1 nm to 3 nm, tube length: 100 nm or more) synthesized by enhanced direct injection pyrolytic synthesis (eDIPS method) were prepared.

To 30 mg of the single-layer CNTs synthesized by the eDIPS method were added 70 mL of isopropyl alcohol and 30 mL of ethanol; 30 mg of polyacrylic acid was further added as an additive; and the mixture was stirred at 1000 rpm (revolutions per minute) for 18 hours at 40° C. using a magnetic stirrer to obtain a suspension.

The obtained suspension was subjected to ultrasonic dispersion at an output of 40% for a total of 2 hours using a probe type ultrasonic homogenizer. At this time, ice cooling was performed every 20 minutes for 5 minutes.

After ultrasonic dispersion, defoaming treatment was performed to obtain a dispersion liquid (crude CNT dispersion liquid) containing crude CNTs. The obtained crude CNT dispersion liquid was centrifuged using a high-speed centrifuge (Himac Technologies Co., Ltd., trade name: CS100GX) under the conditions of an average relative centrifugal force of 150,000×g, 120 minutes, and 10° C.

After the centrifugation, the supernatant was removed to obtain a dispersion liquid (purified CNT dispersion liquid) containing purified CNTs from which aggregates or lumpy CNTs were removed.

The purified CNT dispersion liquid was spin coated on an 8 inch size silicon substrate at a rotation speed of 1500 rpm to obtain a thin film of CNTs on the silicon substrate. The thin film was washed with water to remove polyacrylic acid in the thin film and dried, and then the silicon substrate was immersed in water.

Next, only the thin film of CNTs was left in water, and only the silicon substrate was taken out from water, so that the thin film of CNTs was peeled from the silicon substrate, and a CNT film having a network structure was manufactured in a state of floating on the liquid surface of water.

A CNT self-supported film (pellicle film) of Φ4 mm was disposed on the silicon substrate by scooping the CNT film floating on the liquid surface of water with a silicon support frame having a through-hole of Φ4 mm formed by anisotropic dry etching processing, to obtain a pellicle.

When the thickness of the CNT film was measured using the above-described method, the thickness of the CNT film was 12 nm±0.2 nm.

In addition, an XPS spectrum of the CNT film was acquired using an X-ray photoelectron spectrometer (AXIS-Ultra series manufactured by KRATOS, analysis area: 120 μm). By performing argon ion sputtering at intervals of 10 seconds, a depth profile of an XPS spectrum was obtained. Carbon and oxygen were detected, and the proportion of carbon was calculated from the total amount of carbon and oxygen, and the carbon content rate was 94 mass %.

<EUV Irradiation Experiment>

Next, the pellicle was exposed to EUV light using BL-9H at New Subaru, University of Hyogo. At this time, the partial pressure of water was changed as shown in Table 2. In addition, the luminances of the CNT film before and after exposure were measured.

Specifically, the pellicle obtained above was inserted into a vacuum chamber, and then vacuuming was further performed for 12 hours. Water vapor was added to the inside of the chamber at the time when the degree of vacuum of the chamber reached $2 \times 10^{-5}$ Pa.

A water vapor inflow amount from a water vapor line to the inside of the chamber was adjusted using a variable leak valve to adjust the water partial pressure to be constant at the values shown in Table 2. The water vapor pressure inside the chamber was measured by a cold cathode vacuum system.

Residual gas composition analysis was performed using a quadrupole mass spectrometer connected to the chamber, and it was confirmed that the main component of the gas species in the chamber at the time when water vapor was added was water.

For the EUV light by the photodiode, intensity measurement and beam size measurement by a fluorescent plate were performed to measure the irradiation density of EUV light of 13.5 nm. The irradiation density was 6 W/cm$^2$.

After continuous irradiation with EUV light for 1 hour under the conditions of the respective water partial pressures described in Table 2, the influence on the CNT film was evaluated.

<Evaluation of CNT Film Damage>

Evaluation of damage on film surface (microscopic observation)

The EUV-irradiated portion on the CNT film was observed using a digital microscope (product name: VHX-6000, Swing-head Zoom Lens VH-ZST, manufactured by KEYENCE CORPORATION).

The above observation was performed at a magnification of 20 times under illumination conditions of a coaxial epi-illumination mode (reflected image), an exposure time of 0.43 msec, a gain of 0 dB, and white balance presetting of R=945, G=256, and B=590.

In the region of the film surface of the CNT self-supported film, the luminance in the case of 256 gradations of gray scale was adjusted to be in a range of 105 to 115, and the luminance of a hole portion where the film did not exist was adjusted to be 40 to 50.

The pellicle film after EUV irradiation was placed on a stage, and the stage position was adjusted so that the EUV-irradiated portion was at the center of the image, to acquire an image.

After the obtained image was converted into a 256-gradation gray scale, the luminance of the gray scale was measured for a 0.5×0.1 mm region (EUV-irradiated region luminance measurement unit) which is located further at the center of a 2.0 mm×0.4 mm internal region irradiated with the EUV.

Next, the luminance of the gray scale was measured for a region about 1 mm away from the EUV-irradiated region in a direction perpendicular to the direction of the long side of the beam (that is, the EUV-unirradiated region).

Microscopic observation in the coaxial epi-illumination mode (reflection mode) has the following characteristics, and is suitable for evaluation of CNT film damage and film reduction.

In the film without wrinkles or deflection, as the thickness of the CNT film is relatively thicker, the reflected light intensity in the microscopic image is higher, and thus the luminance is also higher. On the other hand, as the thickness of the film decreases, the reflected light intensity of the microscopic image relatively decreases, and thus the luminance is also lower.

Therefore, when a film having a uniform thickness is observed in the reflection mode, the reflection intensity is constant, so that the luminance of the observed region appears uniform.

On the other hand, in a case where there is a region where the film is thinned due to film reduction or the like, the region where the film is thinned has a lower reflectance than that of the surrounding region, and thus, is observed as a dark region, and the luminance appears low.

From the above, a region where the CNT film is etched at the EUV-irradiated portion due to the presence of oxygen radicals, hydrogen radicals, or the like so that film reduction occurs is observed as a dark region (that is, a region with low luminance) due to a decrease in reflected light intensity.

On the other hand, in a region where no film reduction occurs at the EUV-irradiated portion, the reflected light intensity does not change, and thus, no change in appearance is observed.

For example, a CNT film having a thickness of 15 nm has a reflectance of 6%.

In the above-described microscopic luminance measurement, in a case where the luminance of the region where no film exists is 50 and the luminance of the region where the film exists is 110, the reflectance changes by 1% with the change in luminance by 6.

In addition, in the case of a CNT film whose film thickness is in a range of 10 nm to 20 nm, the change in luminance by 6 (that is, change in reflectance by 1%) corresponds to the amount of the film reduction of 1 nm.

From the viewpoint of suppressing the amount of the film reduction, the amount of change in luminance is preferably 5 or less, and more preferably 3 or less.

TABLE 2

| | Partial pressure of water | Luminance of CNT film in EUV-irradiated portion | Luminance of CNT film in EUV-unirradiated portion | Amount of change in luminance of CNT film |
|---|---|---|---|---|
| Example 1 | $1.0 \times 10^{-4}$ Pa | 110 | 111 | 1 |
| Example 2 | $4.0 \times 10^{-4}$ Pa | 108 | 110 | 2 |
| Example 3 | $8.0 \times 10^{-4}$ Pa | 106 | 112 | 6 |
| Example 4 | $100.0 \times 10^{-4}$ Pa | 50 | 108 | 58 |

As shown in Table 2, it was found that under the EUV exposure environment, Experimental Examples 1 and 2 in which the partial pressure of water was $5.0 \times 10^{-4}$ Pa or less can suppress the decrease in thickness of the CNT film as compared with Experimental Examples 3 and 4 in which the partial pressure of water was more than $5.0 \times 10^{-4}$ Pa.

As shown in Table 2, in Experimental Example 1 in which the partial pressure of water was $1.0 \times 10^{-4}$ Pa, no irradiation trace was observed after EUV irradiation. The difference in luminance between the EUV-irradiated portion and the unirradiated portion was 1, and film reduction was also not observed.

In Experimental Example 2 in which the partial pressure of water was $4.0 \times 10^{-4}$ Pa, no irradiation trace was observed after EUV irradiation. The difference in luminance between the EUV-irradiated portion and the unirradiated portion was 2, and film reduction was not observed.

In Experimental Example 3 in which the partial pressure of water was $8.0 \times 10^{-4}$ Pa, irradiation traces were observed after EUV irradiation. The difference in luminance between the EUV-irradiated portion and the unirradiated portion was 6, and film reduction was observed.

In Experimental Example 4 in which the partial pressure of water was $100.0 \times 10^{-4}$ Pa, breakage was observed in the irradiated region after EUV irradiation. The difference in luminance between the EUV-irradiated portion (hole region) and the unirradiated portion was 58.

—Relationship Between Partial Pressure of Moisture in Chamber and Amount of Generated Outgas of Pellicle—

In order to suppress damage to the CNT film due to residual water vapor inside the chamber, the water partial pressure inside the pellicle as well as that inside the chamber is important.

When a closed space such as a pellicle is formed, it is necessary for a gas present inside the pellicle to pass through a pellicle film by diffusion in order that the gas moves to the outside of the pellicle.

Since the diffusion of gas molecules is inhibited by the presence of the pellicle film, the gas concentration inside the pellicle is higher than that outside the pellicle.

For a pellicle film that does not allow water molecules or hydrogen molecules to pass therethrough, such as a poly-silicon film or a silicon film, the gas passes through a vent hole or a slit formed in a frame and thus moves.

Unlike a polysilicon film, a silicon film, or the like, a pellicle film made of CNT has air permeability, but has resistance when the gas passes therethrough, as in a general filter, so that a differential pressure is generated. That is, even in an air-permeable film such as a CNT film, the gas concentration (pressure) inside the pellicle is higher than the gas concentration (pressure) outside the pellicle.

The concentration of the residual gas in the pellicle is estimated by the following method.

A case where a pellicle is disposed inside a chamber in which a vacuum pump having a displacement V [L/sec] is installed is considered.

When the outgas generated inside the pellicle at an amount R of released gas diffuses at a speed vg inside the pellicle, and the gas molecules colliding with a ventilation portion having an area Ahole move to the outside with a probability f, a pressure P [Pa] of the residual gas inside the pellicle can be expressed by the following equation.

[Mathematical Formula 5]

$$P = \frac{RV}{1000kTv_g A_{hole} f} \approx 1 \qquad \text{Equation 1}$$

In Equation 1, R is an amount [Pa·L/sec] of released gas (water) in the pellicle; V is an internal volume [m$^3$] of the pellicle; k is a Boltzmann constant ($1.38 \times 10^{-23}$[m$^2$ kgs$^{-2}$ K$^{-1}$]; T is an absolute temperature (298 [K]); vg is an average speed [m/s] of the gas (for example, 640 m/s in the case of water); Ahole is an opening area [m$^2$] of the ventilation portion which is a boundary between the inside and the outside of the pellicle; and f is a coefficient representing a probability that the gas can move to the outside when reaching the ventilation portion, and is a value of 0 to 1.

When the ventilation portion is an air-impermeable film such as a silicon film, f is 0, and when the ventilation portion does not have a film, f=1. When the film has air permeability such as a CNT film or a filter, but only some of molecules contacting or colliding with the ventilation portion pass to the outside, f has a value between 0 and 1.

In a pellicle using a CNT film having a closed space formed by an adhesive, the gas ventilation portion is a region of the CNT film, and an opening area of the ventilation portion is about 0.14×0.1=0.014 [m$^2$].

In an actual exposure environment, the inside of the chamber is filled with hydrogen gas, and the inside of the pellicle is also filled with hydrogen gas. The outgas (for example, water molecules) released into the pellicle diffuses while colliding with hydrogen molecules with which the pellicle is filled, reaches the pellicle film, and some of the water molecules colliding with the film can move to the outside.

An average free step of hydrogen molecules inside the chamber or inside the pellicle is approximately 2 mm, which is shorter than the size of the pellicle. Therefore, the water molecules diffuse into the pellicle while repeating collision with the hydrogen molecules many times. That is, apparently, the moving speed of the water molecules in vacuum decreases.

By further considering the probability that the gas passes through the pellicle film in addition to the decrease in moving speed, the value off is considered to be a value of approximately 0.0001.

The gas is released into the pellicle from a member, such as an adhesive or a frame, of the pellicle, and a main component of the gas is water. Therefore, by using the amount of released water as the amount R of released gas, the pressure of moisture in the pellicle can be obtained from Equation 1.

For example, when the amount of released aqueous outgas inside the pellicle is $5.0 \times 10^{-4}$ Pa·L/s, the partial pressure of water inside the pellicle during exposure is $5.2 \times 10^{-4}$ Pa. Therefore, the deterioration of the CNT film can be suppressed by using a pellicle in which the amount of released aqueous outgas is $5.0 \times 10^{-4}$ Pa·L/s or less.

Example 1

The CNT film manufactured in each of the above-described experimental examples was each scooped up with an aluminum frame (outer dimension: 151 mm×118.5 mm, inner dimension: 143 mm×110.5 mm, height: 2.0 mm) as a support frame, so that a pellicle film was disposed on the aluminum frame to obtain a pellicle.

Thereafter, a hydrogenated styrene-based hot-melt adhesive as an adhesive was applied, at a thickness of 200 μm and a width of 2.5 mm, to the surface of the support frame in an opening on a side opposite to a side to which the CNT film was connected, using a hot-melt dispenser (350PC Smart, ML808GX manufactured by Musashi Engineering, Inc.) to form an adhesive layer.

A glass substrate was stuck and fixed to the obtained adhesive layer to manufacture a pellicle including a pellicle film, a support frame, and an adhesive layer. The surface area of the adhesive layer is shown in Table 3.

Using the manufactured pellicle, the total amount of aqueous outgas was measured by the above-described method. The evaluation results are shown in Table 3.

In addition, the moisture content rate of the adhesive layer was measured by the above-described method. The evaluation results are shown in Table 3.

Example 2

A pellicle film was disposed on an aluminum frame in the same manner as in Example 1 to obtain a pellicle.

Thereafter, an acrylic pressure-sensitive adhesive manufactured by the following method as an adhesive was applied, at a thickness of 200 μm and a width of 2.5 mm, to the surface of the support frame in an opening on a side opposite to a side to which the CNT film was connected, using a dispenser (350PC Smart, ML808GX, manufactured by Musashi Engineering, Inc.). After flattening, the adhesive was cured by heating at 120° C. for 1 hour in an inert gas atmosphere, thereby forming an adhesive layer.

A glass substrate was stuck and fixed to the obtained adhesive layer to manufacture a pellicle including a pellicle film, a support frame, and an adhesive layer. The surface area of the adhesive layer is shown in Table 3.

Using the manufactured pellicle, the total amount of aqueous outgas was measured by the above-described method. The evaluation results are shown in Table 3.

In addition, the moisture content rate of the adhesive layer was measured by the above-described method. The evaluation results are shown in Table 3.

—Method of Manufacturing Acrylic Pressure-Sensitive Adhesive—

To 100 parts by mass of an acrylic pressure-sensitive adhesive (Artcure RA-341 manufactured by Negami Chemical Industrial Co., Ltd., solid content concentration: 100 mass %), 65 parts by mass of toluene was added, and they were stirred at room temperature to adjust a polymer having a solid content concentration of 35 mass %. To 100 parts by mass of the polymer were added 1.0 part by mass of a crosslinking agent ("NK Ester A-600" manufactured by Shin Nakamura Chemical Co., Ltd., solid content concentration: 100 mass %) and 0.22 parts by mass of a peroxide-based radical polymerization initiator ("Parcadox 12-XL25" manufactured by Kayaku Akzo Co., Ltd., solid content concentration: 25 mass %); and the mixture was stirred at room temperature to manufacture an acrylic pressure-sensitive adhesive having a solid content concentration ratio of RA-341:A-600:Percadox 12-XL25=100:2.86:0.16.

Example 3

A pellicle film was disposed on an aluminum frame in the same manner as in Example 1 to obtain a pellicle.

Thereafter, an epoxy resin (Araldite 2012 manufactured by Huntsman International LLC.) as an adhesive was applied, at a thickness of 50 μm and a width of 0.5 mm, to the surface of the support frame in an opening on a side opposite to a side to which the CNT film was connected, using a two-liquid mixing type dispenser (350PC Smart, MPP-1, manufactured by Musashi Engineering, Inc.) to form an adhesive layer.

A glass substrate was stuck and fixed to the obtained adhesive layer, and the adhesive was cured by heating at 90° C. for 2 hours to manufacture a pellicle including a pellicle film, a support frame, and an adhesive layer. The surface area of the adhesive layer is shown in Table 3.

Using the manufactured pellicle, the total amount of aqueous outgas was measured by the above-described method. The evaluation results are shown in Table 3.

In addition, the moisture content rate of the adhesive layer was measured by the above-described method. The evaluation results are shown in Table 3.

Example 4

A pellicle film was disposed on an aluminum frame in the same manner as in Example 1 to obtain a pellicle.

Thereafter, a hydrogenated styrene-based hot-melt adhesive as an adhesive was applied, at a thickness of 200 μm and a width of 2.5 mm, to the surface of the support frame in an opening on a side opposite to a side to which the CNT film was connected, using a hot-melt dispenser (350PC Smart, ML808GX manufactured by Musashi Engineering, Inc.), and flattening is performed to form an adhesive layer.

A masking film was bonded to the adhesive layer with a width of 1 mm from the central portion of the surface of the adhesive layer opposite to the surface in contact with the aluminum frame.

After bonding the masking film, the exposed portion of the adhesive was coated with gold at a thickness of 100 nm using magnetron sputtering.

The adhesive layer was covered with gold except for the portion to which the masking film was bonded, and it was microscopically confirmed that the side surface portion having a thickness of 200 μm was also coated with gold.

The coverage of gold with respect to the total surface area of the adhesive was 65%.

After the gold coating, the masking film was peeled to expose a part of the adhesive portion, and a glass substrate was stuck to manufacture a pellicle including a pellicle film, a support frame, and an adhesive layer.

Since the exposed surface of the adhesive is in contact with the glass surface, the region exposed to the surface is only the side portion of the gold-coated adhesive.

The surface area of the adhesive layer is shown in Table 3.

Using the manufactured pellicle, the total amount of aqueous outgas was measured by the above-described method. The evaluation results are shown in Table 3.

In addition, the moisture content rate of the adhesive layer was measured by the above-described method. The evaluation results are shown in Table 3.

Example 5

A pellicle film was disposed on an aluminum frame in the same manner as in Example 1 to obtain a pellicle.

Thereafter, a hydrogenated styrene-based hot-melt adhesive as an adhesive was applied, at a thickness of 200 μm and a width of 2.5 mm, to the surface of the support frame in an opening on a side opposite to a side to which the CNT film was connected, using a hot-melt dispenser, two-liquid mixing type dispenser (350PC Smart, MPP-1 manufactured by Musashi Engineering, Inc.) to form an adhesive layer.

A glass substrate was stuck and fixed to the obtained adhesive layer, and left to stand for 16 hours in a vacuum pressure reducing device of normal temperature and $1 \times 10^{-4}$ Pa, and subjected to a dehydration treatment to manufacture a pellicle including a pellicle film, a support frame, and an adhesive layer. The surface area of the adhesive layer is shown in Table 3.

Using the manufactured pellicle, the total amount of aqueous outgas was measured by the above-described method. The evaluation results are shown in Table 3.

In addition, the moisture content rate of the adhesive layer was measured by the above-described method. The evaluation results are shown in Table 3.

Comparative Example 1

A pellicle film was disposed on an aluminum frame in the same manner as in Example 1 to obtain a pellicle.

Thereafter, an epoxy resin (Araldite 2012 manufactured by Huntsman International LLC.) as an adhesive was applied, at a thickness of 200 μm and a width of 1.5 mm, to the surface of the support frame in an opening on a side opposite to a side to which the CNT film was connected, using a two-liquid mixing type dispenser (350PC Smart, MPP-1, manufactured by Musashi Engineering, Inc.) to form an adhesive layer.

A glass substrate was stuck and fixed to the obtained adhesive layer, and the adhesive was cured by heating at 90° C. for 2 hours to manufacture a pellicle including a pellicle film, a support frame, and an adhesive layer. The surface area of the adhesive layer is shown in Table 3.

Using the manufactured pellicle, the total amount of aqueous outgas was measured by the above-described method. The evaluation results are shown in Table 3.

The total amount of aqueous outgas inside the pellicle, which affects the deterioration of the pellicle film, was determined from the ratio of the surface area of the adhesive layer to the surface area of the adhesive layer inside the pellicle.

In addition, the moisture content rate of the adhesive layer was measured by the above-described method. The evaluation results are shown in Table 3.

reference in its entirety. All documents, patent applications, and technical standards described herein are incorporated herein by reference to the same extent as if each document, patent application, and technical standard are specifically and individually indicated to be incorporated by reference.

The invention claimed is:

1. A pellicle comprising:
   a pellicle film including a carbon-based film having a carbon content rate of 40 mass % or more;
   a support frame that supports the pellicle film; and
   an adhesive layer containing an adhesive, wherein the adhesive layer has a moisture content rate of 2.00 mass % or less, and wherein the adhesive is at least one selected from the group consisting of a silicone resin adhesive, an acrylic resin adhesive, a hydrogenated styrene-based adhesive, and an epoxy resin adhesive,

TABLE 3

| | Adhesive | Moisture content rate (mass %) of adhesive layer | Surface area (cm²) of adhesive layer | Surface area (cm²) of adhesive layer inside pellicle | Support frame | Coating | Vacuum treatment | Total amount (Pa · L/s) of aqueous outgas | Total amount (Pa · L/s) of aqueous outgas inside pellicle |
|---|---|---|---|---|---|---|---|---|---|
| Example 1 | Hydrogenated styrene-based hot-melt adhesive | 0.06 | 2.0 | 1.0 | Aluminum | None | None | $3.0 \times 10^{-4}$ | $1.5 \times 10^{-4}$ |
| Example 2 | Acrylic | 0.78 | 2.0 | 1.0 | Aluminum | None | None | $3.8 \times 10^{-4}$ | $1.9 \times 10^{-4}$ |
| Example 3 | Epoxy-based | 2.86 | 0.50 | 0.25 | Silicon | None | None | $4.0 \times 10^{-4}$ | $2.0 \times 10^{-4}$ |
| Example 4 | Hydrogenated styrene-based hot-melt adhesive | 0.06 | 2.0 | 1.0 | Aluminum | Present | None | $2.0 \times 10^{-4}$ | $1.0 \times 10^{-4}$ |
| Example 5 | Hydrogenated styrene-based hot-melt adhesive | Measurement limit or less | 2.0 | 1.0 | Aluminum | None | Present | $2.0 \times 10^{-5}$ | $1.0 \times 10^{-5}$ |
| Comparative Example 1 | Epoxy-based | 2.86 | 2.0 | 1.0 | Aluminum | None | None | $2.0 \times 10^{-3}$ | $1.0 \times 10^{-3}$ |

As shown in Table 3, in the pellicles including the configurations of Examples 1 to 5, the total amount of aqueous outgas released into the pellicle was suppressed to $5.0 \times 10^{-4}$ or less.

On the other hand, in the pellicle including the configuration of Comparative Example 1, the total amount of aqueous outgas released into the pellicle could not be suppressed to $5.0 \times 10^{-4}$ or less.

As described above, by suppressing the total amount of aqueous outgas to $5.0 \times 10^{-4}$ or less, a decrease in thickness of the CNT film can be suppressed.

Therefore, it was demonstrated that the pellicles of Examples 1 to 5 in which the total amount of aqueous outgas was suppressed to $5.0 \times 10^{-4}$ or less can suppress a reduction in thickness of the CNT film and can suppress the deterioration of the pellicle film.

Further, in Example 1 in which the adhesive having a moisture content rate of 0.06 mass % was used for formation of the adhesive layer and Example 3 in which the adhesive having a moisture content rate of 2.86 mass % was used, it was demonstrated that, although the surface area of the adhesive layer in Example 1 was larger than that in Example 3, the total amount of aqueous outgas released into the pellicle including the configuration of Example 1 was suppressed more.

The disclosure of Japanese Patent Application No. 2020-134100 filed on Aug. 6, 2020 is incorporated herein by the pellicle having a total amount of aqueous outgas of $5.0 \times 10^{-4}$ Pa·L/sec or less in an atmosphere of 23° C. and $1 \times 10^{-3}$ Pa or less.

2. The pellicle according to claim 1, wherein the adhesive layer inside the pellicle has a surface area of 0.03 cm² to 2.5 cm².

3. The pellicle according to claim 1, wherein the support frame includes a first support frame that supports the pellicle film and a second support frame connected to the first support frame.

4. The pellicle according to claim 1, further comprising a separator disposed in contact with the adhesive layer.

5. An exposure original plate comprising:
   an original plate having a pattern; and
   the pellicle according to claim 1 attached to a surface of the original plate having a pattern.

6. An exposure device comprising the exposure original plate according to claim 5.

7. An exposure device comprising:
   a light source that emits exposure light;
   the exposure original plate according to claim 5; and
   an optical system that guides the exposure light emitted from the light source to the exposure original plate,
   wherein the exposure original plate is disposed such that the exposure light emitted from the light source permeates the pellicle film and is applied to the original plate.

8. The exposure device according to claim 7, wherein the exposure light is EUV light.

9. A method of manufacturing a semiconductor device, the method comprising:

a step of allowing exposure light emitted from a light source to permeate the pellicle film of the exposure original plate according to claim 5 to apply the exposure light to the original plate, and reflecting the exposure light on the original plate; and a step of allowing the exposure light reflected by the original plate to permeate the pellicle film and applying the exposure light to a sensitive substrate, thereby exposing the sensitive substrate to light in a pattern shape.

10. A method of manufacturing a pellicle, the method comprising:

a step of preparing a carbon-based material having a carbon content rate of 40 mass % or more;

a step of forming a film of the carbon-based material in a sheet shape to manufacture a pellicle film;

a step of connecting the pellicle film to a support frame so as to cover an opening of the support frame having the opening; and a step of forming an adhesive layer by applying an adhesive to a surface of the support frame in an opening on a side opposite to a side to which the pellicle film is connected, wherein the adhesive layer has a moisture content rate of 2.00 mass % or less, and wherein the adhesive is at least one selected from the group consisting of a silicone resin adhesive, an acrylic resin adhesive, a hydrogenated styrene-based adhesive, and an epoxy resin adhesive.

\* \* \* \* \*